US012808949B2

(12) United States Patent
Takenaka et al.

(10) Patent No.: US 12,808,949 B2
(45) Date of Patent: Nov. 24, 2026

(54) CONTROL DEVICE

(71) Applicant: TOYOTA JIDOSHA KABUSHIKI KAISHA, Toyota (JP)

(72) Inventors: Tetsuhiro Takenaka, Miyoshi (JP); Takanori Asai, Toyota (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 291 days.

(21) Appl. No.: 18/640,457

(22) Filed: Apr. 19, 2024

(65) Prior Publication Data

US 2025/0076407 A1 Mar. 6, 2025

(30) Foreign Application Priority Data

Aug. 30, 2023 (JP) ................................ 2023-140232
Oct. 5, 2023 (JP) ................................ 2023-173683

(51) Int. Cl.

*G01R 31/52* (2020.01)
*B60L 3/00* (2019.01)
*G01K 3/10* (2006.01)
*G01K 13/00* (2021.01)
*G01R 31/66* (2020.01)

(52) U.S. Cl.

CPC ............ *G01R 31/52* (2020.01); *B60L 3/0061* (2013.01); *G01K 3/10* (2013.01); *G01K 13/00* (2013.01); *G01R 31/66* (2020.01); *B60L 2240/425* (2013.01)

(58) Field of Classification Search

CPC ....... G01R 31/52; G01R 31/66; B60L 3/0061; B60L 2240/425; B60L 3/00; G01K 3/10; G01K 13/00; G01K 2205/00
See application file for complete search history.

(56) References Cited

U.S. PATENT DOCUMENTS

2013/0233272 A1* 9/2013 Sackmann .............. F23Q 7/001
123/198 R
2018/0138847 A1* 5/2018 Kaidu ........................ H02P 6/16
2020/0333382 A1* 10/2020 Lee ........................ G01R 31/58
(Continued)

FOREIGN PATENT DOCUMENTS

CN 108692870 A * 10/2018 ............ G01M 3/007
JP S61259180 A * 11/1986
JP H11-139223 A 5/1999
(Continued)

*Primary Examiner* — Laura Martin Sweeney
*Assistant Examiner* — Julia Fitzpatrick
(74) *Attorney, Agent, or Firm* — SoraIP, Inc.

(57) ABSTRACT

A control device is disclosed that is connected to a temperature sensor disposed in a drive device of a vehicle via a connector from outside the drive device. The control device executes a process of periodically acquiring the detected temperature by the temperature sensor, a process of calculating a first temperature difference which is an absolute difference between the detected temperature and the previously detected temperature acquired one cycle before the detected temperature, and a process of determining that the foreign object has entered the connector when the sudden temperature change condition of the first temperature difference is equal to or higher than the first predetermined temperature is repeatedly satisfied up to a predetermined number of times at an interval within the first predetermined period.

2 Claims, 4 Drawing Sheets

(56) References Cited

U.S. PATENT DOCUMENTS

| | | | | |
|---|---|---|---|---|
| 2023/0112526 A1* | 4/2023 | Potter | ................ | G01R 19/2513 702/58 |
| 2023/0173980 A1 | 6/2023 | Sin et al. | | |

FOREIGN PATENT DOCUMENTS

| | | | | | |
|---|---|---|---|---|---|
| JP | 2000230960 | A | * | 8/2000 | |
| JP | 2002-084776 | A | | 3/2002 | |
| JP | 2015-532086 | A | | 11/2015 | |
| JP | 2018-082581 | A | | 5/2018 | |
| JP | 2023057072 | A | * | 4/2023 | |
| KR | 20040028372 | A | * | 4/2004 | ............ G01M 3/025 |
| WO | 2014/036013 | A2 | | 3/2014 | |

* cited by examiner

CONTROL DEVICE

CROSS-REFERENCE TO RELATED APPLICATION

This application claims priority to Japanese Patent Application No. 2023-140232 filed on Aug. 30, 2023, and Japanese Patent Application No. 2023-173683 filed on Oct. 5, 2023, each incorporated herein by reference in its entirety.

BACKGROUND

1. Technical Field

The technology disclosed herein relates to a control device.

2. Description of Related Art

Japanese Unexamined Patent Application Publication No. 11-139223 (JP 11-139223 A) discloses a control device for detecting an abnormality in a vehicle wire harness. The control device detects the abnormality in the wire harness based on a temperature detected by a thermistor wound around the wire harness.

SUMMARY

In a vehicle, a foreign object such as water may enter a connector of a temperature sensor. In this case, the terminal in the connector is short-circuited by the foreign object, and thus the temperature detected by the temperature sensor exhibits an abnormal value. Therefore, the entry of the foreign object into the connector can be detected by monitoring the temperature detected by the temperature sensor. When a small amount of the foreign object (typically water) enters the connector, however, the foreign object moves in the connector in response to acceleration and deceleration of the vehicle. Therefore, the terminal in the connector is short-circuited by the foreign object or the short circuit is eliminated. In this case, the temperature detected by the temperature sensor exhibits abnormal values intermittently. Therefore, it is difficult to determine whether the fluctuation has occurred due to entry of a foreign object into the connector or due to noise.

The present specification provides a technology capable of determining that a foreign object has entered a connector.

A first aspect disclosed herein discloses a control device to be connected to a temperature sensor disposed in a drive device of a vehicle via a connector from an outside of the drive device. The control device is configured to perform:

- an acquisition process for periodically acquiring a temperature detected by the temperature sensor;
- a first calculation process for, each time the detected temperature is acquired, calculating a first temperature difference that is an absolute difference between the detected temperature and a previous detected temperature acquired one cycle before the detected temperature; and
- a first determination process for determining that a foreign object has entered the connector when a sudden temperature change condition that the first temperature difference is equal to or higher than a first predetermined temperature is repeatedly satisfied up to a predetermined number of times with intervals in a first predetermined period.

As described above, when the foreign object enters the connector, the terminal in the connector is short-circuited by the foreign object. In this case, the temperature detected by the temperature sensor exhibits an abnormal value. Therefore, the sudden temperature change condition that the first temperature difference is equal to or higher than the first predetermined temperature is satisfied. When a small amount of the foreign object enters the connector, the terminal in the connector is short-circuited intermittently, and the sudden temperature change condition is also satisfied intermittently. The sudden temperature change condition may be satisfied accidentally due to influence of noise. When the cause is the small amount of the foreign object that has entered the connector, however, the sudden temperature change condition is repeatedly satisfied at relatively short intervals. Therefore, determination is made that the foreign object has entered the connector when the sudden temperature change condition is repeatedly satisfied up to the predetermined number of times with intervals in the first predetermined period. Thus, the entry of the foreign object can be determined accurately even if the small amount of the foreign object has entered the connector.

In a second aspect, according to the first aspect, the control device may further be configured to perform:

- a second calculation process for, when the sudden temperature change condition is satisfied, storing the previous detected temperature and calculating a second temperature difference that is an absolute difference between the stored previous detected temperature and the detected temperature that is detected after the previous detected temperature; and
- a second determination process for determining that an abnormality has occurred in the temperature sensor when determination that the second temperature difference is equal to or higher than a second predetermined temperature is made continuously for a second predetermined period shorter than the first predetermined period.

When the determination that the second temperature difference is equal to or higher than the second predetermined temperature is made continuously for the second predetermined period, an abnormality (for example, disconnection of a wiring portion of the temperature sensor) different from the abnormality that the foreign object has entered the connector may occur. With the above configuration, the control device can determine that the foreign object has entered the connector, and can determine that the different abnormality has occurred.

In a third aspect, according to the first or second aspect, the first determination process may include:

- a process for counting the number of times the sudden temperature change condition is repeatedly satisfied with the intervals in the first predetermined period;
- a process for determining that the foreign object has entered the connector when the counted number of times has reached the predetermined number of times; and
- a process for clearing the counted number of times when the sudden temperature change condition is not satisfied for the first predetermined period before the counted number of times reaches the predetermined number of times.

In the above configuration, the control device clears the counted number of times when the sudden temperature change condition is not satisfied for the first predetermined period. With such a configuration, it is possible to determine more accurately that the foreign object has entered the connector than in a configuration in which the counted number of times is not cleared.

In a fourth aspect, according to any one of the first to third aspects, the temperature sensor may be a sensor configured to detect a temperature of a lubricating liquid in the drive device.

In a fifth aspect, according to any one of the first to fourth aspects, the drive device may include an electric motor configured to drive a wheel of the vehicle.

In a sixth aspect, according to any one of the first to fifth aspects, the control device may further be configured to perform:

- a third determination process for determining that a first type of foreign object has entered the connector when the sudden temperature change condition is satisfied and the first temperature difference is equal to or higher than a third predetermined temperature; and
- a fourth determination process for determining that a second type of foreign object has entered the connector when the sudden temperature change condition is satisfied and the first temperature difference is lower than the third predetermined temperature.

The amount of fluctuation in the detected temperature varies depending on the type of foreign object entering the connector. With the above configuration, the control device can appropriately determine the type of the foreign object that has entered the connector based on the first temperature difference.

In a seventh aspect, according to the sixth aspect,
the first type of foreign object may be water, and
the second type of foreign object may be metal.

Foreign objects that are likely to enter the connector are water and metal. Therefore, the control device can determine whether the foreign object that has entered the connector is water or metal.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Examples

Figure 1:
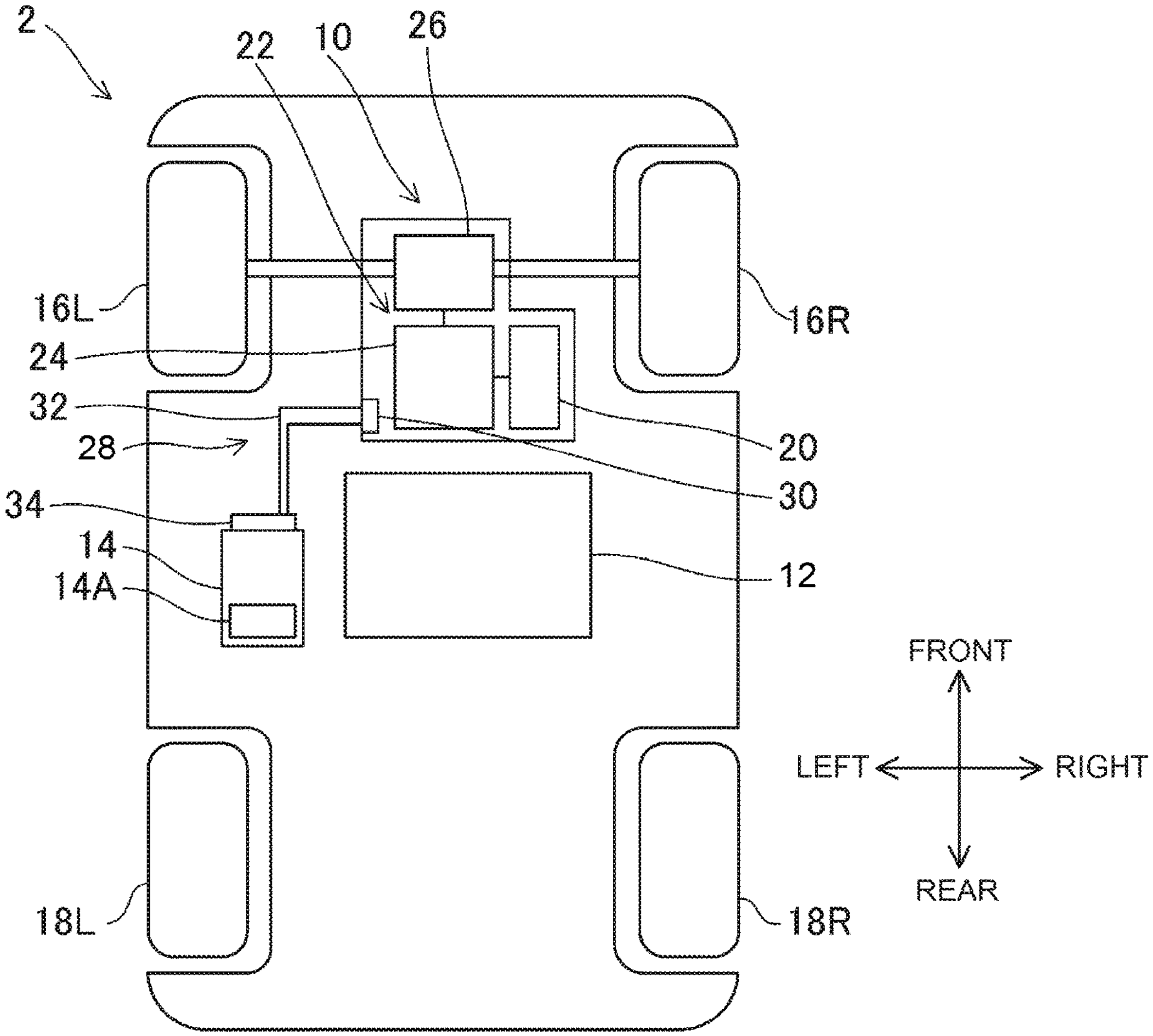
FIG. 1 shows a configuration of a vehicle 2.

As illustrated in FIG. 1, the vehicle 2 includes a drive device 10, a battery 12, a control device 14, a left front wheel 16L, a right front wheel 16R, a left rear wheel 18L, and a right rear wheel 18R. The battery 12 includes a plurality of secondary battery cells and is configured to be rechargeable by an external power source (not shown). As an example, the secondary battery cell is a lithium ion cell.

The drive device 10 includes an electric motor 20 and a gear unit 22. The electric motor 20 is a device that drives the left front wheel 16L and the right front wheel 16R of the vehicle 2 by electric power supplied from the battery 12. The electric motor 20 is connected to the left front wheel 16L and the right front wheel 16R via a gear unit 22. The gear unit 22 includes a planetary gear mechanism 24 and a differential mechanism 26. The planetary gear mechanism 24 amplifies the output torque of the electric motor 20. The differential mechanism 26 distributes the power transmitted from the planetary gear mechanism 24 to the left front wheel 16L and the right front wheel 16R.

Lubricating fluid for lubricating and cooling the electric motor 20 and the gear unit 22 is stored in the drive device 10. A temperature sensor 28 for detecting the temperature of the lubricating liquid is attached to the drive device 10. The temperature sensor 28 includes a detection unit 30, a wiring portion 32, and a connector 34. A detection unit 30 is connected to one end of the wiring portion 32, and a connector 34 is connected to the other end. The connector 34 is electrically connected to a connector of the control device 14.

The control device 14 is a controller including a memory 14A. The control device 14 controls the operation of the electric motor 20 and the like in accordance with a program (not shown) stored in the memory 14A. A temperature sensor 28 is electrically connected to the control device 14. The control device 14 is configured to periodically (e.g., at a period of tens of milliseconds) acquire the temperature detected by the temperature sensor 28. The memory 14A stores a first abnormality flag and a second abnormality flag. The first abnormality flag indicates either "OFF" indicating that an abnormality caused by the intrusion of water into the connector 34 has not occurred, or "ON" indicating that an abnormality has occurred in the temperature sensor 28 due to the intrusion of water into the connector 34 being determined. The second abnormality flag indicates either "OFF" indicating that an abnormality caused by the intrusion of metal into the connector 34 has not occurred, or "ON" indicating that an abnormality has occurred in the temperature sensor 28 due to the intrusion of metal into the connector 34 being determined.

Figure 2:
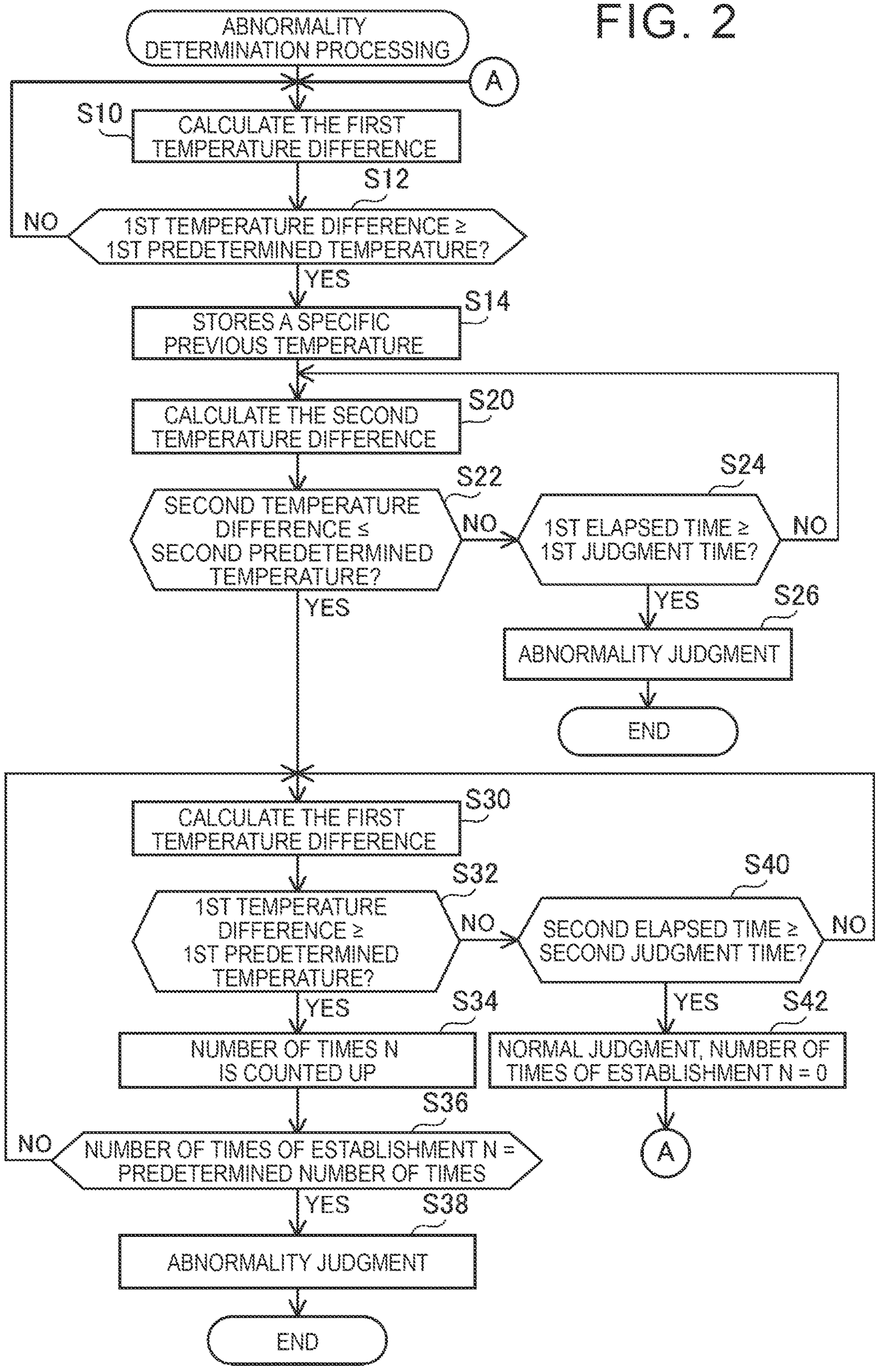
FIG. 2 shows a flowchart of an abnormality determination process executed by the control device 14 of the vehicle 2.

Abnormality Determination Processing; FIG. 2

An abnormality determination process executed by the control device 14 of the vehicle 2 will be described with reference to FIG. 2. The abnormality determination process is a process for determining whether or not various abnormalities have occurred based on the temperature detected by the temperature sensor 28. The control device 14 starts the process of FIG. 2 when an ignition switch (not shown) of the vehicle 2 is turned on.

In S10, the control device 14 calculates the first temperature difference by using the detected temperature periodically acquired from the temperature sensor 28. The first temperature difference is an absolute difference between the acquired detected temperature and the detected temperature (hereinafter, referred to as "previous detected temperature") acquired one cycle ago. The previously detected temperature is stored in the memory 14A.

In S12, the control device 14 monitors that a sudden temperature change condition in which the first temperature difference is equal to or higher than the first predetermined temperature is satisfied. As the first predetermined temperature, a threshold value for detecting an abnormality in the temperature detected by the temperature sensor 28 is set. As an example, the first predetermined temperature is 10° C. When the first temperature difference is equal to or higher than the first predetermined temperature, the control device 14 determines YES in S12, and proceeds to S14.

In S14, the control device 14 stores the previously detected temperature as a particular previously detected temperature in the memory 14A.

In S20, the control device 14 calculates the second temperature difference by using the detected temperature periodically acquired and the specified previously detected temperature stored in the memory 14A. The second temperature difference is an absolute difference between the acquired detected temperature and a specific previous detected temperature.

In S22, the control device 14 monitors that the second temperature difference becomes equal to or lower than the second predetermined temperature. As the second predetermined temperature, a threshold value for detecting that the temperature sensor 28 is normal is set. As an example, the second predetermined temperature is 5° C. When the second temperature difference is equal to or lower than the second predetermined temperature, the control device 14 determines YES in S22 and proceeds to S30.

In addition, the control device 14 monitors that the first elapsed time is equal to or longer than the first determination time in S24 simultaneously with the monitoring of S22. The first elapsed time is an elapsed time since S12 is determined to be YES. When the first elapsed time is equal to or longer than the first determination time, the control device 14 determines YES in S24 and proceeds to S26.

In S26, the control device 14 determines that an anomaly has been determined in the temperature sensor 28. The abnormality in this case is an abnormality in which the wiring portion 32 of the temperature sensor 28 is disconnected, an abnormality in which a large amount of water enters the connector 34, or the like. If it is determined that an abnormality has occurred in the temperature sensor 28, the control device 14 notifies the user that an abnormality has occurred in the temperature sensor 28. As an example, the control device 14 turns on a warning lamp (not shown) of the instrument panel. Thus, the user can know that an abnormality has occurred in the temperature sensor 28. When S26 ends, the control device 14 ends the process of FIG. 2.

In addition, in S30, the control device 14 calculates the first thermal difference.

In S32, the control device 14 monitors that the sudden temperature change condition (that is, the first temperature difference is equal to or higher than the first predetermined temperature) is satisfied. When the sudden temperature change condition is satisfied, the control device 14 determines YES in S32, and proceeds to S34.

In S34, the control device 14 counts up the number of times of establishment N stored in the memory 14A. The number of times of establishment N indicates the number of times that the sudden temperature change condition is satisfied at an interval within the second determination time described later.

In S36, the control device 14 determines whether or not the number of times of establishment N in the memory 14A has reached a predetermined number of times (for example, 10 times). The control device 14 proceeds to S38 when the number of times of establishment N has reached a predetermined number of times (YES in S36). On the other hand, when the number of times of establishment N has not reached the predetermined number of times (NO in S36), the control device 14 returns to S30.

In S38, the control device 14 determines that an anomaly has been determined in the temperature sensor 28. The abnormality detected in this case is, for example, an abnormality in which a small amount of water has entered the connector 34. If it is determined that an abnormality has occurred in the temperature sensor 28, the control device 14 notifies the user that an abnormality has occurred in the temperature sensor 28. As an example, the control device 14 turns on the warning lamp of the instrument panel. As a result, the control device 14, which can know that an abnormality has occurred in the temperature sensor 28, ends the process of FIG. 2 when S38 ends.

In addition, the control device 14 monitors, concurrently with the monitoring of S32, that the second elapsed time is equal to or longer than the second determination time in S40. The second elapsed time is a time elapsed without the sudden temperature change condition being satisfied. As an example, the second determination time is 20 seconds and is longer than the first determination time. When the second elapsed time is equal to or longer than the second determination time, the control device 14 determines YES in S40 and proceeds to S42.

In S42, the control device 14 determines that the temperature sensor 28 is normal and clears the number of times of establishment N. When S42 ends, the control device 14 returns to S10.

Figure 3:
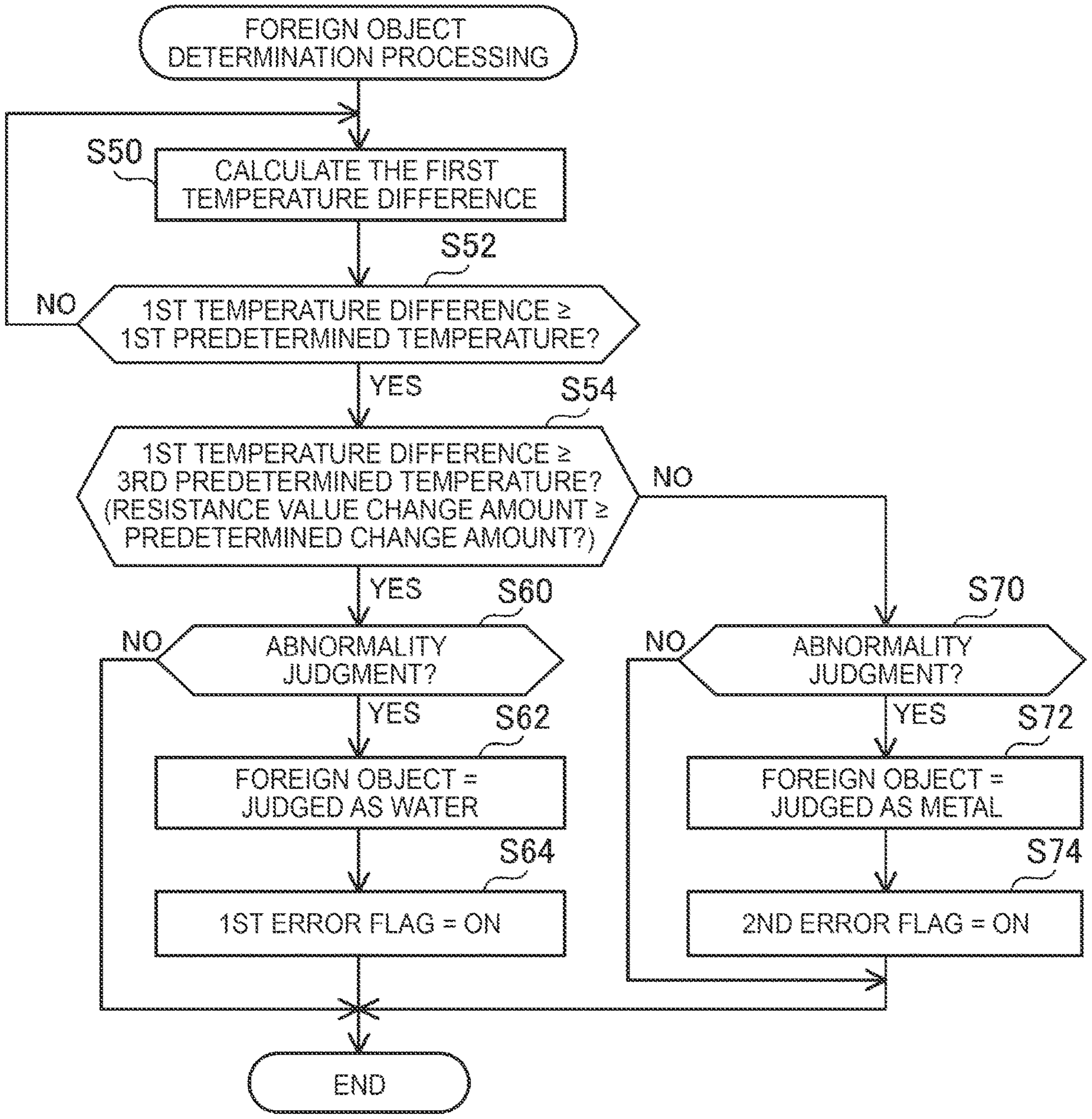
FIG. 3 shows a flow chart of a foreign object determination process executed by the control device 14 of the vehicle 2.

Foreign Object Determination Processing; FIG. 3

Referring to FIG. 3, a foreign object determination process executed by the control device 14 of the vehicle 2 will be described. The foreign object determination process is a process for specifying the type of foreign object that has entered the connector 34. The control device 14 starts the process of FIG. 3 when the ignition switch of the vehicle 2 is turned on.

Each S50, S52 is similar to S10, S12 of FIG. 2.

In S54, the control device 14 determines whether or not the first temperature difference is equal to or higher than the third predetermined temperature. The third predetermined temperature is a threshold value for determining whether the foreign object that has entered the connector 34 is water or metal. Specifically, the control device 14 converts the first temperature difference into the amount of change in the voltage, and specifies the amount of change in the resistance value (hereinafter, referred to as "the amount of change in the resistance value") by using the amount of change in the converted voltage. Then, the control device 14 determines whether or not the resistance value change amount is equal to or greater than a predetermined change amount. When the resistance-value change amount is equal to or greater than the predetermined change amount, the control device 14 determines that the first temperature difference is equal to or greater than the third predetermined temperature (YES in S54), and proceeds to S60. On the other hand, when the resistance value change amount is less than the predetermined change amount, the control device 14 determines that the first temperature difference is less than the third predetermined temperature (NO in S54), and proceeds to S70.

In S60, the control device 14 determines whether or not an abnormality is determined in the temperature sensor 28 in the abnormality determination process of FIG. 2. When it is determined that the temperature sensor 28 is abnormal (YES in S60), the control device 14 proceeds to S62. On the other hand, when it is determined that the temperature sensor 28 is normal (NO in S60), the control device 14 ends the process of FIG. 3.

In S62, the control device 14 determines that the foreign object that has entered the connector 34 is water.

In S64, the control device 14 changes the first anomaly flag from "OFF" to "ON". In response to the first abnormal flag being changed to "ON", the control device 14 lowers the upper limit of the output value of the electric motor 20 to the first upper limit value. When S64 ends, the control device 14 ends the process of FIG. 3.

S70 is similar to S60.

In addition, in S72, the control device 14 determines that the foreign object that has entered the connector 34 is metallic.

In S74, the control device 14 changes the second anomaly flag from "OFF" to "ON". In response to the second anomaly flag being changed to "ON", the control device 14 lowers the upper limit of the output value of the electric motor 20 to the second upper limit value smaller than the first upper limit value. That is, the control device 14 switches the upper limit of the output value of the electric motor 20 according to the type of the foreign object that has entered the connector 34. When S74 ends, the control device 14 ends the process of FIG. 3.

Figure 4:
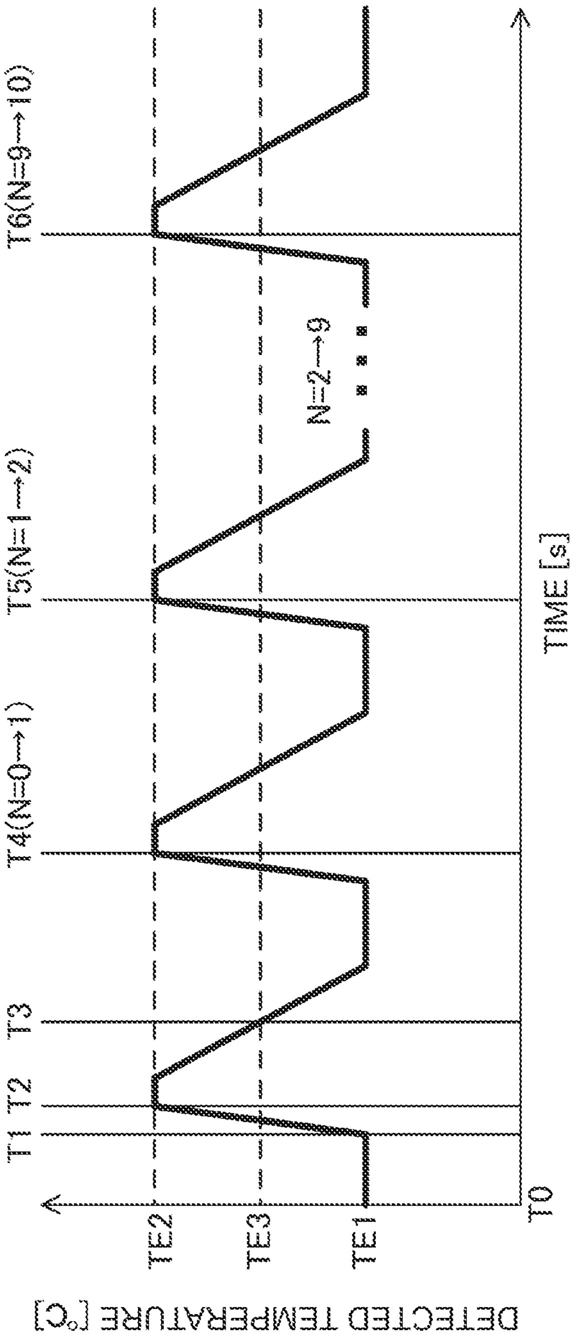
FIG. 4 shows a time chart when a small amount of water has entered the connector 34 of the temperature sensor 28.

Specific Case; FIG. 4

With reference to FIG. 4, a specific case will be described in which it is determined that an abnormality has been determined in the temperature sensor 28 due to the ingress of a small amount of water into the connector 34 of the temperature sensor 28. The vertical axis of the time chart of FIG. 4 represents the detected temperature.

The detected temperature between the time T0 and T1 is substantially constant in the temperature TE1. Therefore, in T1 from the time T0, the vehicle 2 determines that the first temperature difference is less than the first predetermined temperature (NO in S12 of FIG. 2, and NO in S52 of FIG. 3).

At time T2, the terminals in the connector 34 are shorted due to water ingress into the connector 34 of the temperature sensor 28. Consequently, the detected temperature of the temperature sensor 28 suddenly changes from the temperature TE1 to the temperature TE2. That is, the detected temperature indicates an abnormal value. The absolute difference between the temperature TE2 and the temperature TE1 is greater than the first predetermined temperature. Therefore, the vehicle 2 determines that the first temperature difference is equal to or higher than the first predetermined temperature (YES in S12), and stores the temperature TE1 in the memory 14A as a particular previously detected temperature (S14).

In the time T2, the vehicle 2 determines that the first temperature difference is equal to or higher than the first predetermined temperature (YES in S52 of FIG. 3), and uses the first temperature difference to specify the amount of change in the resistance value (hereinafter, referred to as the "amount of change in the resistance value"). In this case, since water enters the connector 34, the amount of change in the resistance value becomes larger than the predetermined amount of change. Therefore, the vehicles 2 are determined to be YES in S54 of FIG. 3.

As in this case, when a small amount of water enters the connector 34, the terminals in the connector 34 are short-circuited by the water or the short-circuit is eliminated in accordance with the acceleration and deceleration of the vehicle 2. By eliminating the short circuit of the terminal in the connector 34, the detected temperature becomes a temperature TE3 lower than the temperature TE2 by the second predetermined temperature at the time T3 that is prior to the elapse of the first determination time from the time T2. Then, the vehicle 2 determines that the second temperature difference is equal to or lower than the second predetermined temperature (YES in S22 of FIG. 2). Thereafter, the detected temperature returns to the temperature TE1.

Then, at time T4 that is prior to the elapse of the second determination time after the second temperature difference becomes equal to or lower than the second predetermined temperature, the terminal in the connector 34 is short-circuited by water. Consequently, the detected temperature suddenly changes from the temperature TE1 to the temperature TE2. In this instance, the vehicle 2 determines that the first temperature difference is equal to or higher than the first predetermined temperature (YES in S32), counts up the number of times of establishment N to "1" (S34), and determines that the number of times of establishment N has not reached the predetermined number (NO in S36). Thereafter, the detected temperature returns to the temperature TE1.

Next, at time T5 that is prior to the elapse of the second determination time after the first temperature difference becomes equal to or higher than the first predetermined temperature, the terminal in the connector 34 is short-circuited by water. Consequently, the detected temperature suddenly changes from the temperature TE1 to the temperature TE2. In this instance, the vehicle 2 determines that the first temperature difference is equal to or higher than the first predetermined temperature (YES in S32), counts up the number of times of establishment N to "2" (S34), and determines that the number of times of establishment N has not reached the predetermined number (NO in S36). Thereafter, the terminals in the connector 34 are short-circuited by water or the short-circuited terminals are eliminated. As a result, the sudden temperature change condition is intermittently established. Then, the number of times of establishment N is counted up in response to the establishment of the sudden temperature change condition (S34).

At the time T6 after the number of times of establishment N is counted up to "9", the terminal in the connector 34 is short-circuited by water. Consequently, the detected temperature suddenly changes from the temperature TE1 to the temperature TE2. In this instance, the vehicle 2 determines that the first temperature difference is equal to or higher than the first predetermined temperature (YES in S32), counts up the number of times of establishment N to "10" (S34), and determines that the number of times of establishment N has reached the predetermined number (YES in S36). In this instance, the vehicle 2 determines that an anomaly has been determined in the temperature sensor 28 (S38), and turns on the warning lamp of the instrument panel. Thus, the user can know that an abnormality has occurred in the temperature sensor 28. In this way, even if a small amount of water enters the connector 34, the intrusion of water into the connector 34 of the temperature sensor 28 is detected.

In the time T6, the vehicle 2 determines that an abnormality is determined in the temperature sensor 28 in the abnormality determination process of FIG. 2 (YES in S60 of FIG. 3). Further, the vehicle 2 determines that the foreign object entering the connector 34 is water (S62), and changes the first anomaly flag from "OFF" to "ON". Thus, the vehicle 2 lowers the upper limit of the output value of the electric motor 20 to the first upper limit value.

As described above, the control device 14 first executes a process of periodically acquiring the detected temperature by the temperature sensor 28, and a process of calculating a first temperature difference (S10, S30 of FIG. 2) which is an absolute difference between the detected temperature and the previously detected temperature acquired one cycle ago each time the detected temperature is acquired. Further, the control device 14 executes a process (S38) of determining that water (an example of "foreign object") enters the connector 34 when the sudden temperature change condition of the first temperature difference being equal to or higher than the first predetermined temperature repeatedly holds up to a predetermined number of times at intervals within the second determination time (an example of the "first predetermined period") (YES in S36).

When water enters the connector 34, the terminals in the connector 34 are short-circuited by the water. When the temperature detected by the temperature sensor 28 indicates an abnormal value, a sudden temperature change condition in which the first temperature difference is equal to or higher than the first predetermined temperature is satisfied (YES in S32 of FIG. 2). At this time, if a small amount of water enters the connector 34, the terminals in the connector 34 are intermittently short-circuited in accordance with acceleration and deceleration of the vehicle 2. As a result, the sudden temperature change condition is also established intermittently. sudden temperature change condition may be accidentally established under the influence of noise, but if it is caused by a small amount of water that has penetrated into the connector 34, the sudden temperature change condition is repeatedly established at relatively short intervals. Therefore, if the sudden temperature change condition is repeatedly established up to a predetermined number of times at intervals within the second determination time (YES in S36), by determining that water is entering the connector 34 (S38), even a small amount of water that has entered into the connector 34, it is possible to accurately determine the intrusion.

In addition, when the sudden temperature change condition is satisfied, the control device 14 stores the last detected temperature (S14), and further executes a second calculation process (S20) of calculating a second temperature difference which is an absolute difference between the detected temperature detected thereafter and the stored last detected temperature. The control device 14 further executes a second determination process (S26) of determining that an anomaly has occurred in the temperature sensor 28 when the determination that the second temperature difference is equal to or higher than the second predetermined temperature is continued for the first determination time shorter than the first predetermined period (an example of the "second predetermined period") (YES in S24).

When the determination that the second temperature difference is equal to or higher than the second predetermined temperature is continued for the first determination time, there is a possibility that an abnormality (for example, disconnection of the wiring portion 32 of the temperature sensor 28, adhesion of foreign object to the detection unit 30, or the like) different from the abnormality in which water enters the connector 34 occurs. According to the above-described configuration, the control device 14 can determine that water is entering the connector 34 and can determine that the above-described different abnormality has occurred.

In addition, the control device 14 executes a process (S34) of counting the number of times of establishment N in which the sudden temperature change condition is repeatedly established at intervals within the second determination time, and a process (S38) of determining that water enters the connector 34 when the number of times of establishment N reaches a predetermined number of times (YES by S36). Further, the control device 14 executes a process (S42) of clearing the number of times of establishment N when the sudden temperature-change determination is not satisfied for the second determination period (YES in S40) prior to the number of times of establishment N reaching a predetermined number of times.

According to the above configuration, the control device 14 clears the number of times of establishment N when the temperature sudden change determination is not satisfied for the second determination time. According to such a configuration, it is possible to more accurately determine that water is entering into the connector 34 as compared with a configuration in which the number of times of establishment N is not cleared.

Further, the control device 14, when the temperature rapid change condition is established, and the first temperature difference is more than the third predetermined temperature (in S32 of FIG. 2, YES in S54 of FIG. 3, YES in S60), it is determined that the water (one example of the first type foreign object) is penetrated into the connector 34 (S62), the sudden temperature change condition is established, and the first temperature difference is less than the third predetermined temperature (YES in S32 of FIG. 2, NO in S54 of FIG. 3, YES in S70), metal (one example of the second type foreign object) in the connector 34 is penetrated (S72).

The amount of variation in the detected temperature varies depending on the type of foreign object entering the connector 34. According to the above configuration, the control device 14 can appropriately determine the type of the foreign object that has entered the connector 34 based on the first temperature difference. In particular, in the present embodiment, the control device 14 can specify whether the foreign object that has entered the connector 34 is water or metal.

Although the specific examples disclosed by the present disclosure have been described in detail above, these are merely examples and do not limit the scope of claims. The techniques described in the claims include various modifications and alternations of the specific example illustrated above. Modifications of the above-described embodiment are listed below.

First Modification

S26 can be omitted from S10 of FIG. 2.

Second Modification

S42 of FIG. 2 can be omitted. In the present modification, the number of times of establishment N may be stored in the volatile memory. In the present modification, when the power of the vehicle 2 is turned OFF, the number of times N of establishment is automatically cleared.

Third Modification

The "temperature sensor" is not limited to a sensor for detecting the temperature of the lubricating liquid, and may be a sensor for detecting the temperature of the high-voltage cable or the low-voltage cable of electrified vehicle.

Fourth Modification

The "vehicle" is not limited to an electrified vehicle, and may be an engine vehicle, a hybrid electric vehicle, fuel cell electric vehicle, a hydrogen-engine vehicle, or the like.

Fifth Modification

The processing of FIG. 3 can be omitted.

Sixth Modification

The third predetermined temperature may be, for example, a threshold value for determining whether a foreign object that has entered the connector 34 is a resin or water.

Seventh Modification

The control device 14 may change the upper limit of the output value of the electric motor 20 only when the first abnormality flag becomes "ON" without changing the upper limit of the output value of the electric motor 20 and the second abnormality flag becomes "ON". In other words, the control device 14 may switch the content (control mode or the like) of the process to be applied between the case where the first abnormality flag becomes "ON" and the case where the second abnormality flag becomes "ON".

The technical elements described in the present specification or drawings exhibit technical usefulness alone or in various combinations, and are not limited to the combinations described in the claims at the time of filing. In addition, the techniques illustrated in the present specification or drawings can achieve a plurality of objectives at the same time, and achieving one of the objectives itself has technical usefulness.

What is claimed is:

1. A control device to be connected to a temperature sensor disposed in a drive device of a vehicle via a connector from an outside of the drive device, the control device comprising an electronic control unit configured to perform:

an acquisition process for periodically acquiring a temperature detected by the temperature sensor;

a first calculation process for, each time the detected temperature is acquired, calculating a first temperature difference that is an absolute difference between the detected temperature and a previous detected temperature acquired one cycle before the detected temperature;

a first determination process for determining that a foreign object has entered the connector when a sudden temperature change condition that the first temperature difference is equal to or higher than a first predetermined temperature is repeatedly satisfied up to a predetermined number of times with intervals in a first predetermined period;

a third determination process for determining that a first type of foreign object has entered the connector when the sudden temperature change condition is satisfied and the first temperature difference is equal to or higher than a third predetermined temperature; and a fourth determination process for determining that a second type of foreign object has entered the connector when the sudden temperature change condition is satisfied and the first temperature difference is lower than the third predetermined temperature.

2. The control device according to claim 1, wherein:

the first type of foreign object is water; and the second type of foreign object is metal.

* * * * *